US009998086B2

(12) United States Patent
Shiokawa

(10) Patent No.: US 9,998,086 B2
(45) Date of Patent: Jun. 12, 2018

(54) LC PARALLEL RESONATOR AND MULTILAYER BAND PASS FILTER

(71) Applicant: Murata Manufacturing Co., Ltd., Nagaokakyo-shi, Kyoto-fu (JP)

(72) Inventor: Noboru Shiokawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days. days.

(21) Appl. No.: 15/268,689

(22) Filed: Sep. 19, 2016

(65) Prior Publication Data

US 2017/0093359 A1 Mar. 30, 2017

(30) Foreign Application Priority Data

Sep. 29, 2015 (JP) ................................ 2015-191127

(51) Int. Cl.
*H03H 7/01* (2006.01)
*H03H 1/00* (2006.01)

(52) U.S. Cl.
CPC ............ *H03H 7/0115* (2013.01); *H03H 1/00* (2013.01); *H03H 7/1775* (2013.01); *H03H 2001/0085* (2013.01)

(58) Field of Classification Search
CPC ......... H03H 2001/0085; H03H 7/0115; H03H 7/09; H03H 7/1775
USPC ................................................ 333/175, 185
See application file for complete search history.

(56) References Cited

U.S. PATENT DOCUMENTS

| 5,251,108 | A | 10/1993 | Doshita |
| 5,739,735 | A * | 4/1998 | Pyykko .................. H01P 7/005 333/175 |
| 6,115,264 | A | 9/2000 | Nosaka |
| 6,437,666 | B1 | 8/2002 | Matsumura et al. |
| 2007/0241839 | A1* | 10/2007 | Taniguchi ................ H03H 7/09 333/185 |
| 2010/0039189 | A1 | 2/2010 | Taniguchi |
| 2012/0319801 | A1 | 12/2012 | Taniguchi |
| 2015/0381138 | A1* | 12/2015 | Tamura .................... H03H 5/12 333/185 |

(Continued)

FOREIGN PATENT DOCUMENTS

| CN | 1133267 C | 12/2003 |
| EP | 2 009 787 A1 | 12/2008 |

(Continued)

*Primary Examiner* — Rakesh Patel
(74) *Attorney, Agent, or Firm* — Keating & Bennett, LLP

(57) ABSTRACT

An LC parallel resonator includes a plurality of dielectric layers stacked on top of one another, a capacitor electrode, and an inductor electrode. The inductor electrode defines a loop including a connection point, as a start point, connected to the capacitor electrode. The inductor electrode includes a first line electrode, first via electrodes, and second via electrodes. The first line electrode extends in a direction perpendicular or substantially perpendicular to a stacking direction of the dielectric layers. The first via electrodes arranged in parallel or substantially in parallel with one another extend in the stacking direction of the dielectric layers, and connect the capacitor electrode to the first line electrode. The second via electrodes arranged in parallel or substantially in parallel with one another extend in the stacking direction of the dielectric layers and are connected to the first line electrode.

14 Claims, 20 Drawing Sheets

(56) References Cited

U.S. PATENT DOCUMENTS

2017/0093358 A1* 3/2017 Imamura ............. H01F 17/0013

FOREIGN PATENT DOCUMENTS

| JP | 04-96814 U | 8/1992 |
| JP | 11-186038 A | 7/1999 |
| JP | 2011-166345 A | 8/2011 |
| TW | 201218623 A1 | 5/2012 |
| WO | 2007/119356 A1 | 10/2007 |
| WO | 2008/143071 A1 | 11/2008 |
| WO | 2011/114851 A1 | 9/2011 |
| WO | 2014/181681 A1 | 11/2014 |

* cited by examiner

FIG. 13

| EMBODIMENT | NUMBER OF LINE ELECTRODE LAYERS | VIA ELECTRODE ARRANGEMENT | PEAK VALUE OF S21 |
|---|---|---|---|
| COMPARATIVE EXAMPLE | 1 | 1 + 1 | −0.865 |
| FIRST EMBODIMENT | 1 | 2 + 2 (PARALLEL ARRANGEMENT) | −0.678 |
| SECOND EMBODIMENT | 1 | 2 + 2 (L ARRANGEMENT) | −0.676 |
| THIRD EMBODIMENT | 2 | 2 + 2 (L ARRANGEMENT) | −0.663 |
| FOURTH EMBODIMENT | 1 (L TYPE) + 1 | 2 + 2 (L ARRANGEMENT) | −0.664 |

LC PARALLEL RESONATOR AND MULTILAYER BAND PASS FILTER

CROSS REFERENCE TO RELATED APPLICATIONS

This application claims the benefit of priority to Japanese Patent Application 2015-191127 filed Sep. 29, 2015. The entire contents of this application are hereby incorporated by reference herein.

BACKGROUND OF THE INVENTION

1. Field of the Invention

The present invention relates to an LC parallel resonator and a multilayer band pass filter including a plurality of the LC parallel resonators.

2. Description of the Related Art

Known examples of high-frequency band pass filters which are appropriate for reducing size and cost include a multilayer band pass filter. An example of a multilayer band pass filter is disclosed in the International Publication No. 2007/119356. In this multilayer band pass filter, a plurality of LC parallel resonators are provided within a multilayer body which includes a plurality of dielectric layers stacked on top of one another. In each of the LC parallel resonators, a loop inductor electrode, starting from a connection point connected to a capacitor electrode, includes line electrodes and inter layer connection conductors (via electrodes). In this multilayer band pass filter, areas (hereafter, also called loop surfaces) surrounded by a loop defined by the corresponding inductor electrode of the LC parallel resonators are superposed with one another. Thus, magnetic coupling between the inductor electrodes of neighboring LC parallel resonators can be enhanced such that a wider band is achieved.

In order to obtain desirable characteristics in a multilayer band pass filter including a plurality of LC parallel resonators, it is necessary to reduce the parasitic resistance of the inductor electrodes and reduce the insertion loss of the multilayer band pass filter.

Examples of methods of reducing magnetic coupling between neighboring LC parallel resonators include a method in which neighboring LC parallel resonators are displaced in the stacking direction of dielectric layers, so as to reduce overlapping between the loop surfaces, a method of inserting a dielectric layer (capacitance layer) which includes a capacitor electrode arranged so as to be superposed with a line electrode when viewed in the stacking direction, and others.

Even when magnetic coupling between LC parallel resonators is reduced, when the size in the stacking direction is increased, the length of a signal path is increased, such that the parasitic resistance of a via electrode is increased and the Q factor may be decreased. As a result, the insertion loss may be increased.

SUMMARY OF THE INVENTION

Preferred embodiments of the present invention provide an LC parallel resonator that enables a reduction in insertion loss, and a multilayer band pass filter including a plurality of the LC parallel resonators.

According to a preferred embodiment of the present invention, an LC parallel resonator includes a plurality of dielectric layers stacked on top of one another; a capacitor electrode; and an inductor electrode. The inductor electrode defines a loop that includes a connection point, as a start point, connected to the capacitor electrode. The inductor electrode includes a first line electrode, one or more first via electrodes, and one or more second via electrodes. The first line electrode extends in a direction perpendicular or substantially perpendicular to a stacking direction of the dielectric layers. The first via electrodes arranged in parallel or substantially in parallel with one another extend in the stacking direction of the dielectric layers, and connect the capacitor electrode to the first line electrode. The second via electrodes arranged in parallel or substantially in parallel to one another extend in the stacking direction of the dielectric layers and are connected to the first line electrode. A sum of a number of the one or more first via electrodes and a number of the one or more second via electrodes is three or more.

A multilayer band pass filter according to a preferred embodiment of the present invention includes three or more LC parallel resonators. Each of the three or more LC parallel resonators include the LC parallel resonators described above. When surfaces of loops defined by the inductor electrodes of neighboring LC parallel resonators among the plurality of the LC parallel resonators are seen from a direction in which the inductor electrodes are arranged, the surfaces of the loops are at least partially superposed with each other.

According to various preferred embodiments of the present invention, the parasitic resistance of the inductor electrode is reduced by setting the sum of the number of the first via electrodes and the number of the second via electrodes to be three or more. As a result, the Q factor is significantly improved and the insertion loss is effectively reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 13 is a diagram illustrating a table summarizing the number of line electrode layers, a via electrode arrangement, and the peak value of S21, in each of a comparative example and preferred embodiments of the present invention.

DETAILED DESCRIPTION OF THE PREFERRED EMBODIMENTS

Figure 1:
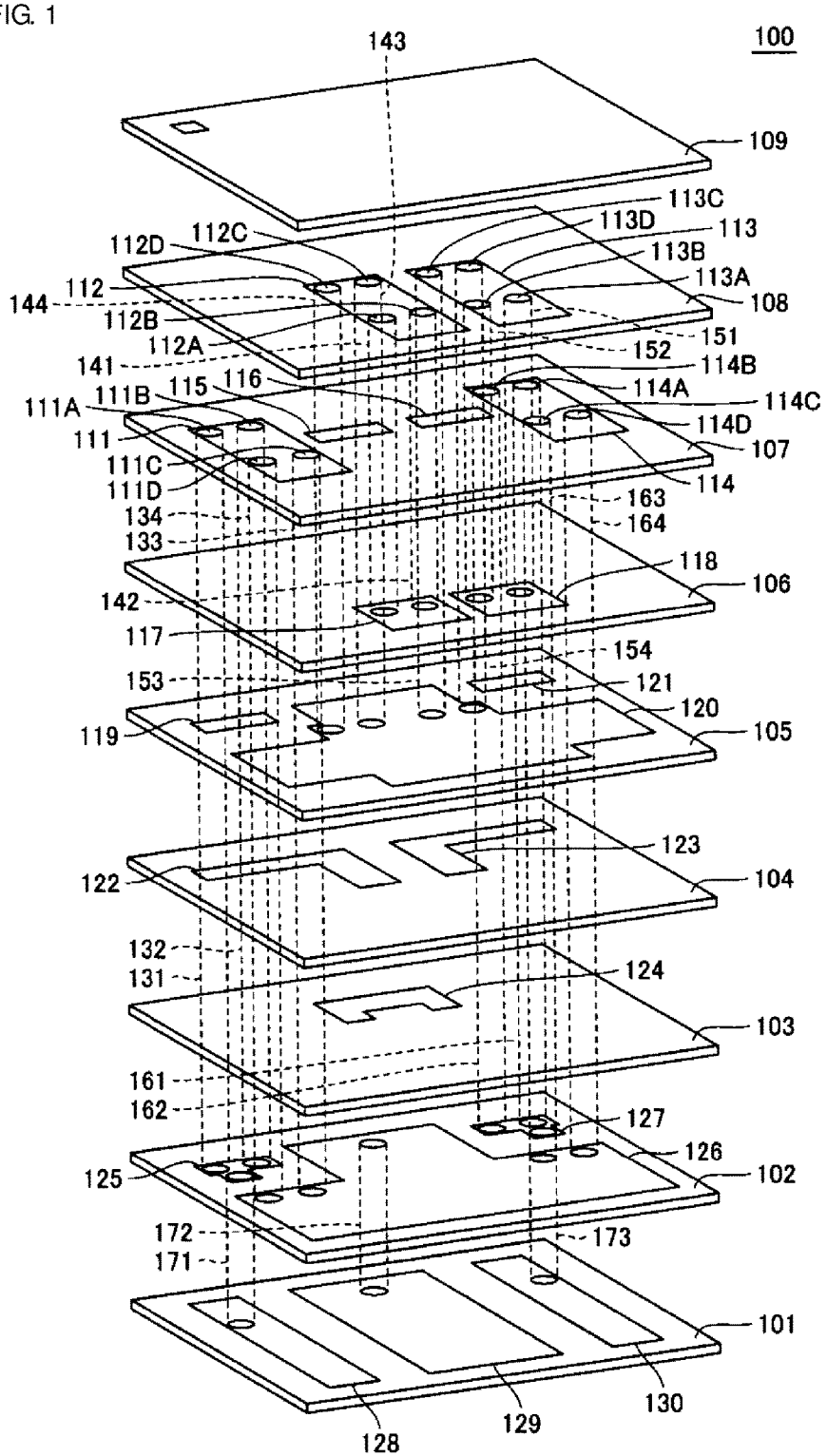
FIG. 1 is an exploded perspective view of a multilayer band pass filter according to a first preferred embodiment of the present invention.

Hereinafter, preferred embodiments of the present invention will be described in detail with reference to the drawings. Note that, in the drawings, identical portions or corresponding portions are denoted by the symbols and duplicated descriptions thereof are not repeated.

First Preferred Embodiment

Figure 2:
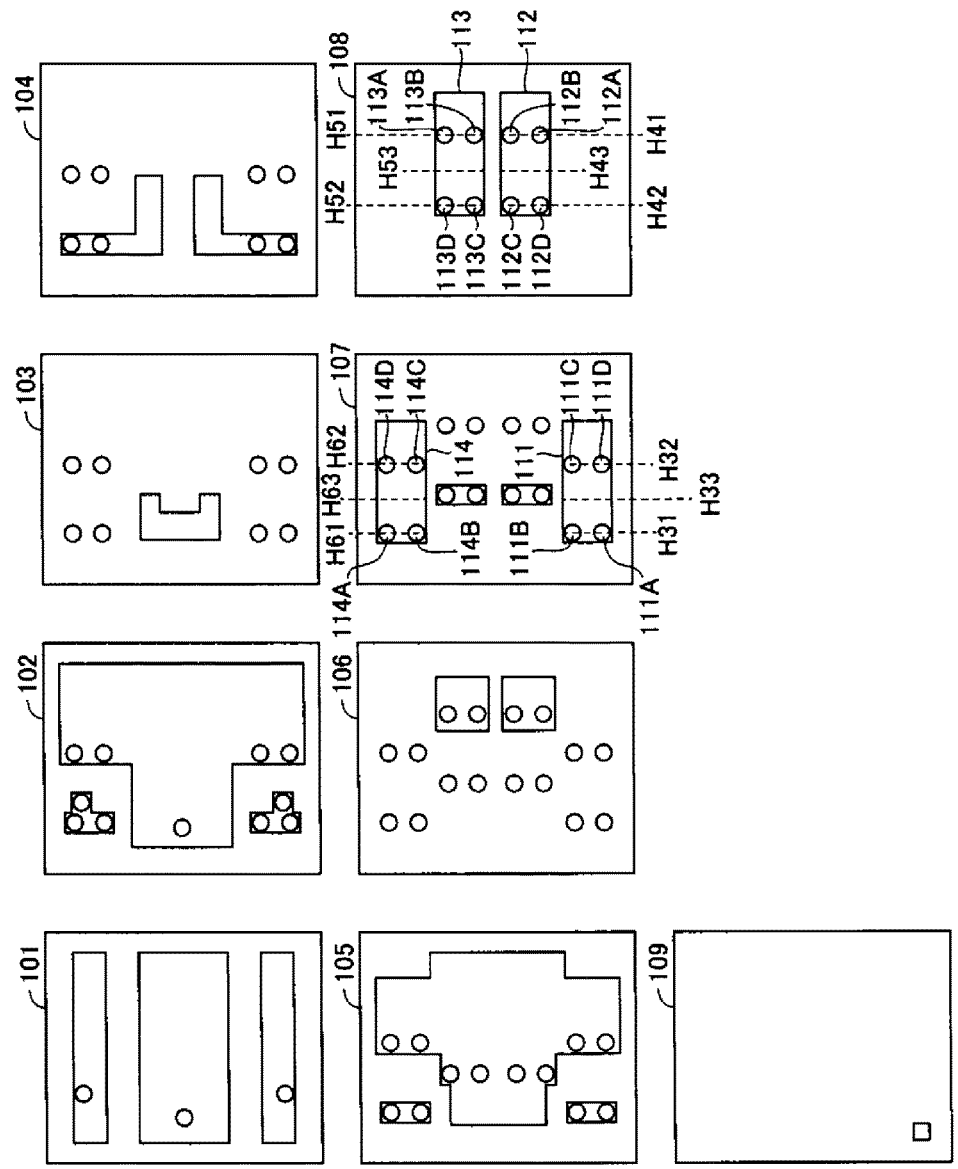
FIG. 2 is a plan view illustrating the individual dielectric layers of the multilayer band pass filter of FIG. 1.

FIG. 1 is an exploded perspective view of a multilayer band pass filter 100 according to a first preferred embodiment of the present invention. FIG. 2 is a plan view illustrating the individual dielectric layers of the multilayer band pass filter 100 of FIG. 1.

As illustrated in FIG. 1, the multilayer band pass filter 100 includes dielectric layers 101 to 109. The dielectric layer 101 includes input output electrodes 128 and 130 and a ground electrode 129 provided thereon. The dielectric layer 102 includes line electrodes 125 and 127 and a ground electrode 126 provided thereon. The dielectric layer 103 includes a capacitor electrode 124 provided thereon. The dielectric layer 104 includes capacitor electrodes 122 and 123 provided thereon. The dielectric layer 105 includes a ground electrode 120 and line electrodes 119 and 121 provided thereon. The dielectric layer 106 includes capacitor electrodes 117 and 118 provided thereon. The dielectric layer 107 includes line electrodes 111, 114, 115, and 116 provided thereon. The dielectric layer 108 includes line electrodes 112 and 113 provided thereon.

The multilayer band pass filter 100 includes via electrodes 131 to 134, 141 to 144, 151 to 154, 161 to 164, and 171 to 173.

The multilayer band pass filter 100 includes first to fourth LC parallel resonators.

The first LC parallel resonator includes the capacitor electrode 122 and a first inductor electrode. The first inductor electrode includes the line electrode 111 (first line electrode), the via electrodes 131 and 132 (first via electrodes), and the via electrodes 133 and 134 (second via electrodes).

The via electrode 131 connects the capacitor electrode 122 to a connection point 111A of the line electrode 111. The via electrode 132 connects the capacitor electrode 122 to a connection point 111B of the line electrode 111.

The via electrode 131 further connects the capacitor electrode 122 to the line electrode 125. The via electrode 132 further connects the capacitor electrode 122 to the line electrode 125. The via electrode 171 connects the line electrode 125 to the input output electrode 128. As such, the first LC parallel resonator is connected to the input output electrode 128.

The via electrode 133 connects the ground electrode 126 to a connection point 111C of the line electrode 111. The via electrode 134 connects the ground electrode 126 to a connection point 111D of the line electrode 111.

As illustrated in FIG. 2, in the line electrode 111 arranged on the dielectric layer 107, the connection points 111A and 111B (first connection points) which are connection points respectively connected to the via electrodes 131 and 132 (first via electrodes) are arranged along a virtual line H31 (first virtual line). The connection points 111C and 111D (second connection points) which are connection points respectively connected to the via electrodes 133 and 134 (second the via electrodes) are arranged along a virtual line H32 (second virtual line). The virtual line H31 is oriented in the direction in which the first to fourth LC parallel resonators are arranged. The virtual line H31 and the virtual line H32 are preferably parallel or substantially parallel to each other. The first connection points and the second connection points are symmetric about a virtual line H33 (third virtual line) which is spaced apart from the virtual line H31 and the virtual line H32 by the same or substantially the same distance. As a result of the first connection points and the second connection points being arranged so as to be line-symmetric with each other, deviations in the current distribution are reduced. Hereinafter, such an arrangement of the first connection points and the second connection points is called a "parallel arrangement".

As illustrated in FIG. 1, the first inductor electrode defines a loop which starts at connection points between the via electrodes 131 and 132 (first via electrodes) and the capacitor electrode 122, passes through a connection defined by the via electrodes 131 and 132 (first via electrodes), the line electrode 111, and the via electrodes 133 and 134 (second via electrodes), and ends at the connection points between the via electrodes 133 and 134 and the ground electrode 126.

When the loop defined by the first inductor electrode is seen from the input output electrode 128 to the input output electrode 130, a turning direction from the start point to the end point through the connection defined by the via electrodes 131 and 132 (first via electrodes), the line electrode 111, and the via electrodes 133 and 134 (second via electrodes) in this sequence is denoted by "1" hereinafter. A turning direction opposite to this direction is denoted by "0" hereinafter.

The second LC parallel resonator includes the capacitor electrode 117 and a second inductor electrode. The second inductor electrode includes the line electrode 112 (first line electrode), the via electrodes 141 and 142 (first via electrodes), and the via electrodes 143 and 144 (second via electrodes). The second LC parallel resonator is adjacent to and neighbors the first inductor electrode.

The via electrode 141 connects the capacitor electrode 117 to a connection point 112A of the line electrode 112. The via electrode 142 connects the capacitor electrode 117 to a connection point 112B of the line electrode 112.

The via electrode 143 connects the ground electrode 120 to a connection point 112C of the line electrode 112. The via electrode 144 connects the ground electrode 120 to a connection point 112D of the line electrode 112.

As illustrated in FIG. 2, in the line electrode 112 arranged on the dielectric layer 108, the connection points 112A and 112B (first connection points) which are connection points respectively connected to the via electrodes 141 and 142 (first via electrodes) are arranged along a virtual line H41 (first virtual line). The connection points 112C and 112D (second connection points) which are connection points respectively connected to the via electrodes 143 and 144 (second the via electrodes) are arranged along a virtual line H42 (second virtual line). The virtual line H42 is oriented in the direction in which the first to fourth LC parallel resonators are arranged. The virtual line H41 and the virtual line H42 are preferably parallel or substantially parallel to each other. The first connection points and the second connection points are symmetric about a virtual line H43 (third virtual line) which is spaced apart from the virtual line H41 and the virtual line H42 by the same or substantially the same distance. The arrangement of the first connection points and the second connection points is a parallel arrangement.

As illustrated in FIG. 1, the second inductor electrode defines a loop which starts at connection points between the via electrodes 141 and 142 (first via electrodes) and the capacitor electrode 117, passes through a connection path defined by the via electrodes 141 and 142 (first via electrodes), the line electrode 112, and the via electrodes 143 and 144 (second via electrodes), and ends at the connection points between the via electrodes 143 and 144 and the ground electrode 120.

When the loop defined by the second inductor electrode is seen from the input output electrode 128 to the input output electrode 130, a turning direction from the start point to the end point through the connection defined by the via electrodes 141 and 142 (first via electrodes), the line electrode 112, and the via electrodes 143 and 144 (second via electrodes) is opposite to the turning direction of the loop defined by the first inductor electrode and, thus, is "0".

The third LC parallel resonator includes the capacitor electrode 118 and a third inductor electrode. The third inductor electrode includes the line electrode 113 (first line electrode), the via electrodes 151 and 152 (first via electrodes), and the via electrodes 153 and 154 (second via electrodes). The third LC parallel resonator is adjacent to and neighbors the opposite side of the second LC parallel resonator with respect to the first LC parallel resonator. In other words, the second LC parallel resonator is arranged between the first LC parallel resonator and the third LC parallel resonator.

The via electrode 151 connects the capacitor electrode 118 to a connection point 113A of the line electrode 113. The via electrode 152 connects the capacitor electrode 118 to a connection point 113B of the line electrode 113.

The via electrode 153 connects the ground electrode 120 to a connection point 113C of the line electrode 113. The via electrode 154 connects the ground electrode 120 to a connection point 113D of the line electrode 113.

As illustrated in FIG. 2, in the line electrode 113 arranged on the dielectric layer 108, the connection points 113A and 113B (first connection points) which are connection points respectively connected to the via electrodes 151 and 152 (first via electrodes) are arranged along a virtual line H51 (first virtual line). The connection points 113C and 113D (second connection points), which are connection points respectively connected to the via electrodes 153 and 154 (second via electrodes) are arranged along a virtual line H52 (second virtual line). The virtual line H52 is oriented in the direction in which the first to fourth LC parallel resonators are arranged. The virtual line H51 and the virtual line H52 are preferably parallel or substantially parallel to each other. The first connection points and the second connection points are symmetric about a virtual line H53 (third virtual line) which is spaced apart from the virtual line H51 and the virtual line H52 by the same or substantially the same distance. The arrangement of the first connection points and the second connection points is a parallel arrangement.

As illustrated in FIG. 1, the third inductor electrode defines a loop which starts at connection points between the via electrodes 151 and 152 (first via electrodes) and the capacitor electrode 118, passes through a connection defined by the via electrodes 151 and 152 (first via electrodes), the line electrode 113, and the via electrodes 153 and 154 (second via electrodes), and ends at the connection points between the via electrodes 153 and 154 and the ground electrode 120.

When the loop defined by the third inductor electrode is seen from the input output electrode 128 to the input output electrode 130, a turning direction from the start point to the end point through the connection defined by the via electrodes 151 and 152 (first via electrodes), the line electrode 113, and the via electrodes 153 and 154 (second via electrodes) is opposite to the turning direction of the loop defined by the first inductor electrode and, thus, is "0".

The fourth LC parallel resonator includes the capacitor electrode 123 and a fourth inductor electrode. The fourth inductor electrode includes the line electrode 114 (first line electrode), the via electrodes 161 and 162 (first via electrodes), and the via electrodes 163 and 164 (second via electrodes). The fourth LC parallel resonator adjacent to and neighbors the opposite side of the third LC parallel resonator with respect to the second LC parallel resonator. In other words, the third LC parallel resonator is arranged between the second LC parallel resonator and the fourth LC parallel resonator.

The via electrode 161 connects the capacitor electrode 123 to a connection point 114A of the line electrode 114. The via electrode 162 connects the capacitor electrode 123 to a connection point 114B of the line electrode 114.

The via electrode 161 further connects the capacitor electrode 123 to the line electrode 127. The via electrode 162 further connects the capacitor electrode 123 to the line electrode 127. The via electrode 173 connects the line electrode 127 to the input output electrode 130. In other words, the fourth LC parallel resonator is connected to the input output electrode 130.

The via electrode 163 connects the ground electrode 126 to a connection point 114C of the line electrode 114. The via electrode 164 connects the ground electrode 126 to a connection point 114D of the line electrode 114.

As illustrated in FIG. 2, in the line electrode 114 arranged on the dielectric layer 107, the connection points 114A and 114B (first connection points), which are connection points respectively connected to the via electrodes 161 and 162 (first via electrodes), are arranged along a virtual line H61 (first virtual line). The connection points 114C and 114D (second connection points), which are connection points respectively connected to the via electrodes 163 and 164 (second via electrodes), are arranged along a virtual line H62 (second virtual line). The virtual line H61 is oriented in the direction in which the first to fourth LC parallel resonators are arranged. The virtual line H61 and the virtual line H62 are preferably parallel or substantially parallel to each other.

The first connection points and the second connection points are symmetric about a virtual line H63 (third virtual line) which is spaced apart from the virtual line H61 and the virtual line H62 by the same or substantially the same distance. The arrangement of the first connection points and the second connection points is a parallel arrangement.

As illustrated in FIG. 1, the fourth inductor electrode defines a loop which starts at connection points between the via electrodes 161 and 162 (first via electrodes) and the capacitor electrode 123, passes through a connection defined by the via electrodes 161 and 162 (first via electrodes), the line electrode 114, the via electrodes 163 and 164 (second via electrodes), and ends at the connection points between the via electrodes 163 and 164 and the ground electrode 126.

When the loop defined by the fourth inductor electrode is seen from the input output electrode 128 to the input output electrode 130, a turning direction from the start point to the end point through the connection defined by the via electrodes 161 and 162 (first via electrodes), the line electrode 114, and the via electrodes 163 and 164 (second via electrodes) is the same as the turning direction of the loop defined by the first inductor electrode and, thus, is "1".

The via electrode 172 connects the ground electrode 126 to the ground electrode 129.

Hereinafter, the types of multilayer band pass filter will be expressed by a list of the turning directions of loops defined by inductor electrodes. For example, in the case of the multilayer band pass filter 100, since a first LC parallel resonator with a direction of "1", a second LC parallel resonator with a direction of "0", a third LC parallel resonator with a direction of "0", a fourth LC parallel resonator with a direction of "1" are provided in this sequence, regarding the turning directions of loops defined by the inductor electrodes, the type of the multilayer band pass filter 100 is expressed as "1001".

In the multilayer band pass filter 100, the line electrode 111 and the line electrode 112 are arranged on different respective dielectric layers as illustrated in FIG. 1. Due to this, the degree by which a loop surface defined by the first inductor electrode and a loop surface defined by the second inductor electrode overlap is smaller than when the line electrodes 111 and 112 are arranged on the same dielectric layer. As a result, magnetic coupling between the first LC parallel resonator and the second LC parallel resonator is reduced.

Similarly, the line electrodes 113 and 114 are arranged on different respective dielectric layers. Due to this, the degree by which a loop surface defined by the third inductor electrode and a loop surface defined by the fourth inductor electrode overlap is smaller than when the line electrodes 113 and 114 are arranged on the same dielectric layer. As a result, magnetic coupling between the third LC parallel resonator and the fourth LC parallel resonator is reduced.

In the first preferred embodiment, a portion of the capacitor electrodes 122 and 123 defining an inductor electrode arranged on the dielectric layer 104 and a portion of the capacitor electrode 124 arranged on the dielectric layer 103 are superposed with each other when viewed in the stacking direction of the dielectric layers. With this configuration, magnetic coupling between the first LC parallel resonator and the fourth LC parallel resonator is reduced, and capacitive coupling between the first LC parallel resonator and the fourth LC parallel resonator is also increased. Further, by arranging the capacitor electrode 124 between the first LC parallel resonator and the fourth LC parallel resonator (between input and output), a signal propagating through the capacitor electrode 124 and a signal propagating between input and output have opposite phases. As a result, an attenuation pole is able to be set to appear at a specific frequency.

When the positions of neighboring LC parallel resonators are shifted with respect to each other in the stacking direction of the dielectric layers thus reducing overlapping of loop surfaces, the size in the stacking direction is increased. This is also the case when a dielectric layer including another capacitor electrode arranged thereon is added so as to be superposed with a portion of the capacitor electrode defining an inductor electrode. As a result, a path over which a signal passes becomes long, such that the parasitic resistance of a via electrode is increased and the Q factor is degraded. This could cause the insertion loss to be increased.

In view of these problems, in the first preferred embodiment, the number of via electrodes included in each of the first and second inductor electrodes is two. With this configuration, the Q factor is able to be improved according to the first preferred embodiment by increasing an area through which a current flows to thus reduce the parasitic resistance of the via electrodes, compared with a case in which the first and second via electrodes each include a single via electrode. As a result, the insertion loss is reduced.

Figure 3:
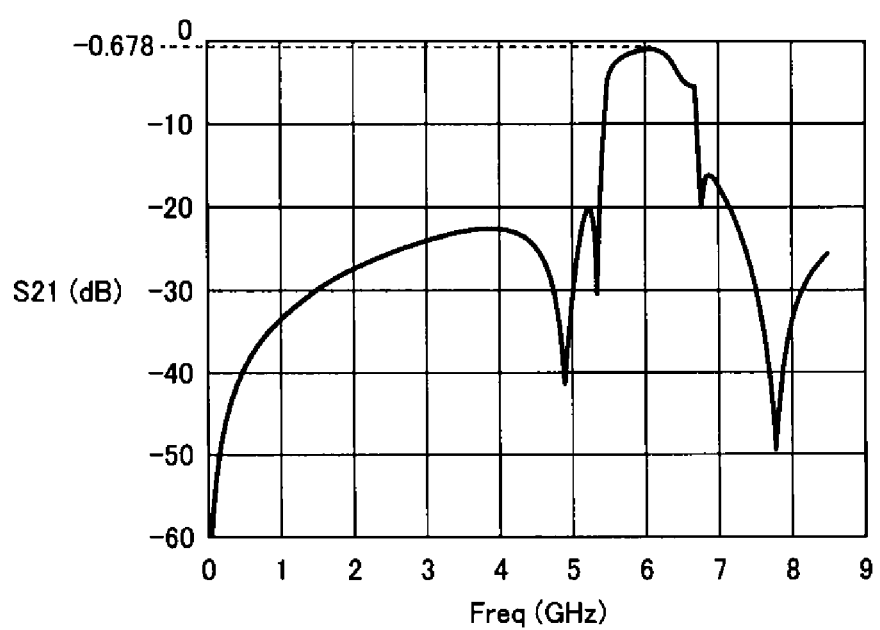
FIG. 3 is a diagram illustrating the insertion loss (S21) of the multilayer band pass filter according to the first preferred embodiment of the present invention.

FIG. 3 is a diagram illustrating the insertion loss (S21) of the multilayer band pass filter 100 according to the first preferred embodiment. As illustrate in FIG. 3, the peak value of S21 of the multilayer band pass filter 100 is about −0.678. The closer to zero this peak value is, the less the insertion loss.

Figure 4:
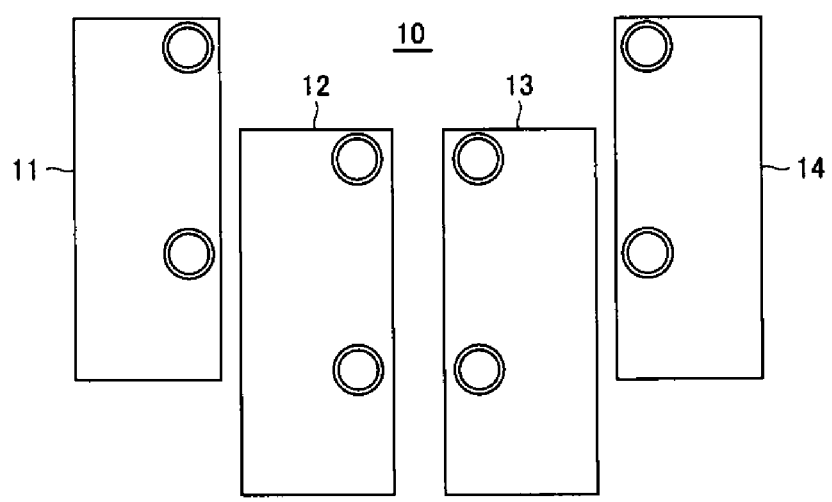
FIG. 4 is a diagram illustrating the arrangement of the via electrodes of a multilayer band pass filter of a comparative example.
Figure 5:
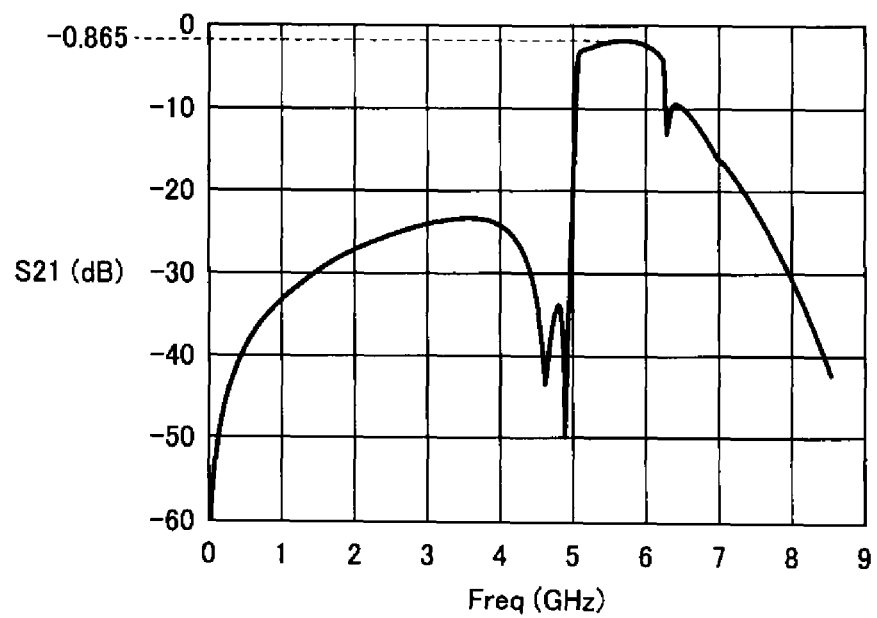
FIG. 5 is a diagram illustrating the insertion loss (S21) of the multilayer band pass filter of FIG. 4.

FIG. 4 is a diagram illustrating the arrangement of the via electrodes of a multilayer band pass filter 10 of a comparative example. Line electrodes 11 to 14 of the multilayer band pass filter 10 respectively correspond to the line electrodes 111 to 114 of the multilayer band pass filter 100. As illustrate in FIG. 4, in the multilayer band pass filter 10, the number of via electrodes corresponding to the first or second via electrodes of preferred embodiments of the present invention is one. FIG. 5 is a diagram illustrating the insertion loss (S21) of the multilayer band pass filter 10. As illustrated in FIG. 5, the peak value of S21 of the multilayer band pass filter 10 is about −0.865.

When comparing the multilayer band pass filter 100 of the first preferred embodiment with the multilayer band pass filter 10 of the comparative example, the peak value of S21 is closer to zero in the multilayer band pass filter 100. Thus, the insertion loss is smaller in the multilayer band pass filter 100 than in the multilayer band pass filter 10.

As described above, according to the multilayer band pass filter 100 of the first preferred embodiment, the parasitic resistance of each inductor electrode is able to be reduced by making the sum of the number of the first via electrodes and the number of the second via electrodes be four. As a result, the Q factor is improved and the insertion loss is reduced.

Second Preferred Embodiment

In the first preferred embodiment, a non-limiting example has been described in which the arrangement of the first connection points and the second connection points in the line electrodes 111 to 114 is a parallel arrangement. The arrangement of the first connection points and the second connection points in the line electrodes is not limited to a parallel arrangement. In a second preferred embodiment of the present invention, a case will be described in which the arrangement of the first connection points and the second connection points in line electrodes is substantially L-shaped.

Unlike the first preferred embodiment, in the second preferred embodiment, the arrangement of the first connection points and the second connection points in line electrodes is preferably substantially L-shaped. The rest of the structure is the same or substantially the same as that in the first preferred embodiment and, thus, the description thereof is not repeated.

Figure 6:
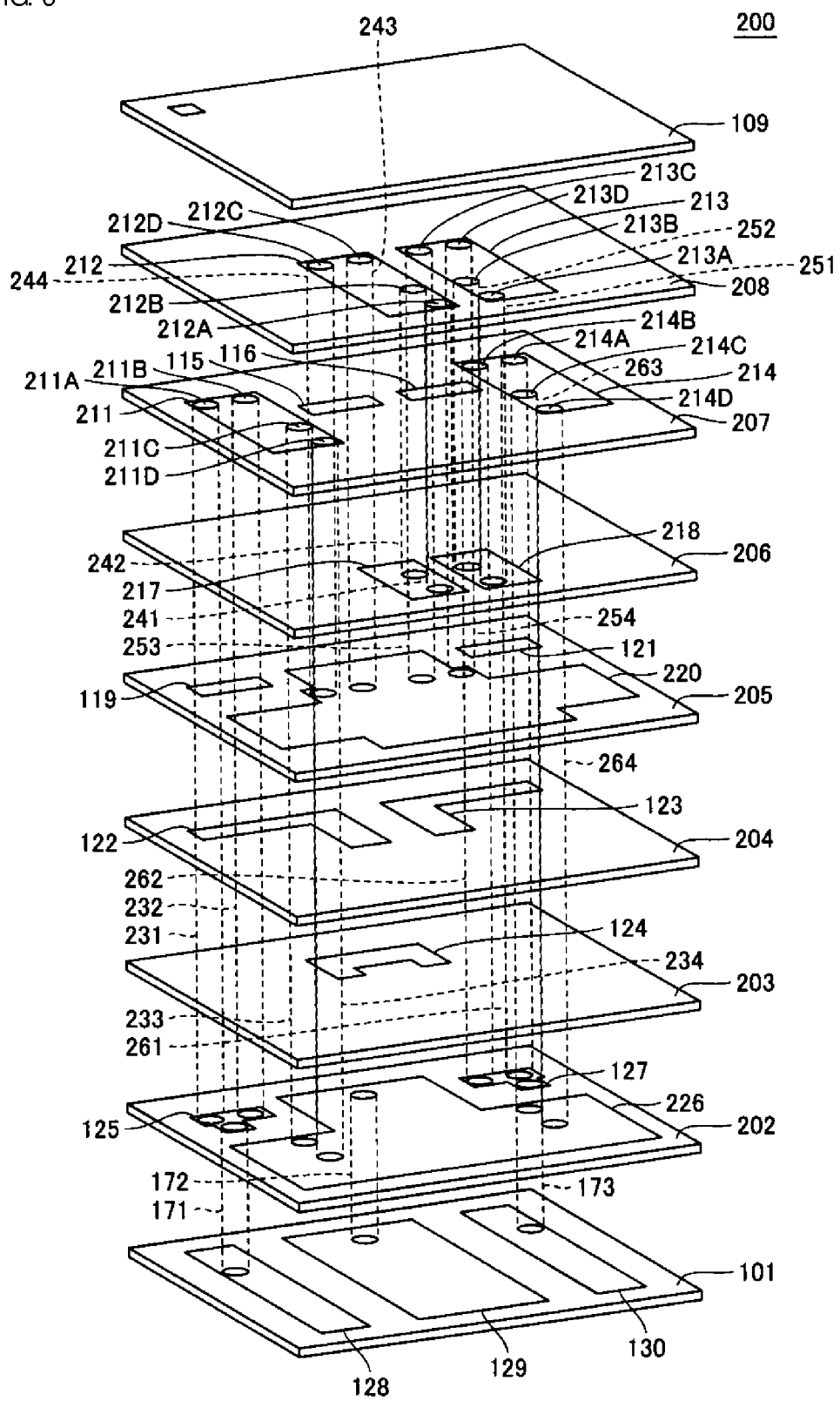
FIG. 6 is an exploded perspective view of a multilayer band pass filter according to a second preferred embodiment of the present invention.
Figure 7:
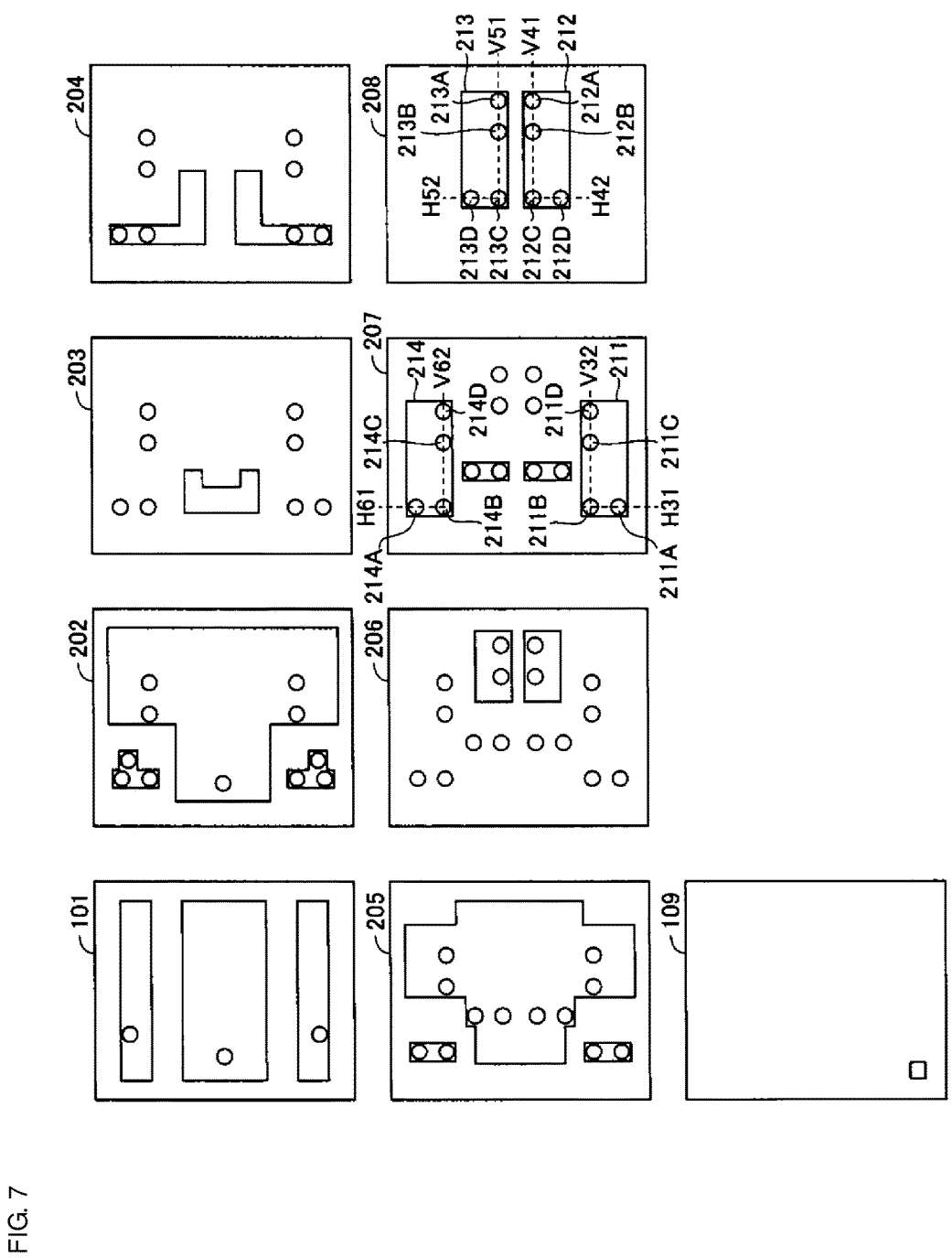
FIG. 7 is a plan view illustrating the individual dielectric layers of the multilayer band pass filter of FIG. 6.

FIG. 6 is an exploded perspective view of a multilayer band pass filter 200 according to the second preferred embodiment. FIG. 7 is a plan view illustrating the individual dielectric layers of the multilayer band pass filter 200 of FIG. 6.

As illustrated in FIG. 6, the multilayer band pass filter 200 includes dielectric layers 101, 202 to 208, and 109. The dielectric layer 202 includes the line electrodes 125 and 127 and a ground electrode 226. The dielectric layer 203 includes the capacitor electrode 124. The dielectric layer 204 includes the capacitor electrodes 122 and 123. The dielectric layer 205 includes a ground electrode 220, the line electrodes 119 and 121. The dielectric layer 206 includes capacitor electrodes 217 and 218. The dielectric layer 207 includes line electrodes 211, 214, 115, and 116. The dielectric layer 208 includes line electrodes 212 and 213.

The multilayer band pass filter 200 includes via electrodes 231 to 234, 241 to 244, 251 to 254, 261 to 264, and 171 to 173.

The multilayer band pass filter 200 includes first to fourth LC parallel resonators.

The first LC parallel resonator includes the capacitor electrode 122 and a first inductor electrode. The first inductor electrode includes the line electrode 211 (first line electrode), the via electrodes 231 and 232 (first via electrodes), and the via electrodes 233 and 234 (second via electrodes).

The via electrode 231 connects the capacitor electrode 122 to a connection point 211A of the line electrode 211. The via electrode 232 connects the capacitor electrode 122 to a connection point 211B of the line electrode 211.

The via electrode 233 connects the ground electrode 226 to a connection point 211C of the line electrode 211. The via electrode 234 connects the ground electrode 226 to a connection point 211D of the line electrode 211.

As illustrated in FIG. 7, in the line electrode 211 arranged on the dielectric layer 207, the connection points 211A and 211B (first connection points), which are connection points respectively connected to the via electrodes 231 and 232 (first via electrodes), are arranged along the virtual line H31 (first virtual line). The connection points 211C and 211D (second connection points), which are connection points respectively connected to the via electrodes 233 and 234 (second via electrodes), are arranged along a virtual line V32 (second virtual line). The virtual line H31 is oriented in the direction in which the first to fourth LC parallel resonators are arranged. The virtual line H31 and the virtual line V32 are preferably perpendicular or substantially perpendicular to each other. The first connection points and the second connection points are substantially L-shaped. Hereinafter, the arrangement of the first connection points and the second connection points like this is called a "substantially L-shaped arrangement". In the second preferred embodiment, the second connection points are preferably located closer to the third LC parallel resonator. In other words, the second connection points are arranged at locations closer to the third LC parallel resonator, among arrangement locations that can substantially form an L shape together with the first connection points. In this way, low-loss current paths are able to be included by providing via electrodes at locations where the magnetic flux of the LC parallel resonator located in the vicinity is concentrated.

As illustrated in FIG. 6, the first inductor electrode defines a loop which starts at connection points between the via electrodes 231 and 232 (first via electrodes) and the capacitor electrode 122, passes through a connection defined by the via electrodes 231 and 232 (first via electrodes), the line electrode 211, and the via electrodes 233 and 234 (second via electrodes), and ends at the connection points between the via electrodes 233 and 234 and the ground electrode 226.

The second LC parallel resonator includes the capacitor electrode 217 and a second inductor electrode. The second inductor electrode includes the line electrode 212 (first line electrode), the via electrodes 241 and 242 (first via electrodes), and the via electrodes 243 and 244 (second via electrodes).

The via electrode 241 connects the capacitor electrode 217 to a connection point 212A of the line electrode 212. The via electrode 242 connects the line electrode 212 to the capacitor electrode 217 at a connection point 212B.

The via electrode 243 connects the ground electrode 220 to a connection point 212C of the line electrode 212. The via electrode 244 connects the ground electrode 220 to a connection point 212D of the line electrode 212.

As illustrated in FIG. 7, in the line electrode 212 arranged on the dielectric layer 208, the connection points 212A and 212B (first connection points), which are connection points connected to the via electrodes 241 and 242 (first via electrodes), are arranged along a virtual line V41 (first virtual line). The connection points 212C and 212D (second connection points), which are connection points connected to the via electrodes 243 and 244 (second via electrodes), are arranged along the virtual line H42 (second virtual line). The virtual line H42 is oriented in the direction in which the first to fourth LC parallel resonators are arranged. The virtual line V41 and the virtual line H42 are preferably perpendicular or substantially perpendicular to each other. The arrangement of the first connection points and the second connection points is a substantially L-shaped arrangement. In the second preferred embodiment, the first connection points are preferably located closer to the third LC parallel resonator. In other words, the first connection points are arranged at locations closer to the third LC parallel resonator, among arrangement locations that can substantially form an L shape together with the second connection points.

As illustrated in FIG. 6, the second inductor electrode defines a loop which starts at connection points between the via electrodes 241 and 242 (first via electrodes) and the capacitor electrode 217, passes through a connection defined by the via electrodes 241 and 242 (first via electrodes), the line electrode 212, and the via electrodes 243 and 244 (second via electrodes), and ends at the connection points between the via electrodes 243 and 244 and the ground electrode 220.

The third LC parallel resonator includes the capacitor electrode 218 and a third inductor electrode. The third inductor electrode includes the line electrode 213 (first line electrode), the via electrodes 251 and 252 (first via electrodes), and via electrodes 253 and 254 (second via electrodes).

The via electrode 251 connects the capacitor electrode 218 to a connection point 213A of the line electrode 213. The via electrode 252 connects the capacitor electrode 218 to a connection point 213B of the line electrode 213.

The via electrode 253 connects the ground electrode 220 to a connection point 213C of the line electrode 213. The via electrode 254 connects the ground electrode 220 to a connection point 213D of the line electrode 213.

As illustrated in FIG. 7, in the line electrode 213 arranged on the dielectric layer 208, the connection points 213A and 213B (first connection points) which are connection points connected to the via electrodes 251 and 252 (first via electrodes) are arranged along a virtual line V51 (first virtual line). The connection points 213C and 213D (second connection points) which are connection points connected to the via electrodes 253 and 254 (second via electrodes) are arranged along the virtual line H52 (second virtual line). The virtual line H52 is oriented in the direction in which the first to fourth LC parallel resonators are arranged. The virtual line V51 and the virtual line H52 are preferably perpendicular or substantially perpendicular to each other. The arrangement the first connection points and the second connection points is a substantially L-shaped arrangement. In the second preferred embodiment, the first connection points are preferably located closer to the second LC parallel resonator. In other words, the first connection points are arranged at locations closer to the second LC parallel resonator, among arrangement locations that can substantially form an L shape together with the second connection points.

As illustrated in FIG. 6, the third inductor electrode defines a loop which starts at connection points between the via electrodes 251 and 252 (first via electrodes) and the capacitor electrode 218, passes through a connection defined by the via electrodes 251 and 252 (first via electrodes), the line electrode 213, and the via electrodes 253 and 254 (second via electrodes), and ends at the connection points between the via electrodes 253 and 254 and the ground electrode 220.

The fourth LC parallel resonator includes the capacitor electrode 123 and a fourth inductor electrode. The fourth inductor electrode includes the line electrode 214 (first line electrode), the via electrodes 261 and 262 (first via electrodes, and via electrodes 263 and 264 (second via electrodes).

The via electrode 261 connects the capacitor electrode 123 to a connection point 214A of the line electrode 214. The via electrode 262 connects the capacitor electrode 123 to a connection point 214B of the line electrode 214.

The via electrode 263 connects the ground electrode 226 to a connection point 214C of the line electrode 214. The via electrode 264 connects the ground electrode 226 to a connection point 214D of the line electrode 214.

As illustrated in FIG. 7, in the line electrode 214 arranged on the dielectric layer 207, the connection points 214A and 214B (first connection points), which are connection points connected to the via electrodes 261 and 262 (first via electrodes), are arranged along a virtual line H61 (first virtual line). The connection points 214C and 214D (second connection points), which are connection points connected to the via electrodes 263 and 264 (second via electrodes), are arranged along the virtual line V62 (second virtual line). The virtual line H61 is oriented in the direction in which the first to fourth LC parallel resonators are arranged. The virtual line H61 and the virtual line V62 are preferably perpendicular or substantially perpendicular to each other. The arrangement of the first connection points and the second connection points is a substantially L-shaped arrangement. In the second preferred embodiment, the second connection points are preferably located closer to the second LC parallel resonator. In other words, the second connection points are arranged at locations closer to the second LC parallel resonator, among arrangement locations that can substantially form an L shape together with the first connection points.

As illustrated in FIG. 6, the fourth inductor electrode defines a loop which starts at connection points between the via electrodes 261 and 262 (first via electrodes) and the capacitor electrode 123, passes through a connection defined by the via electrodes 261 and 262 (first via electrodes), the line electrode 214, and the via electrodes 263 and 264 (second via electrodes), and ends at the connection points between the via electrodes 263 and 264 and the ground electrode 226.

Figure 8:
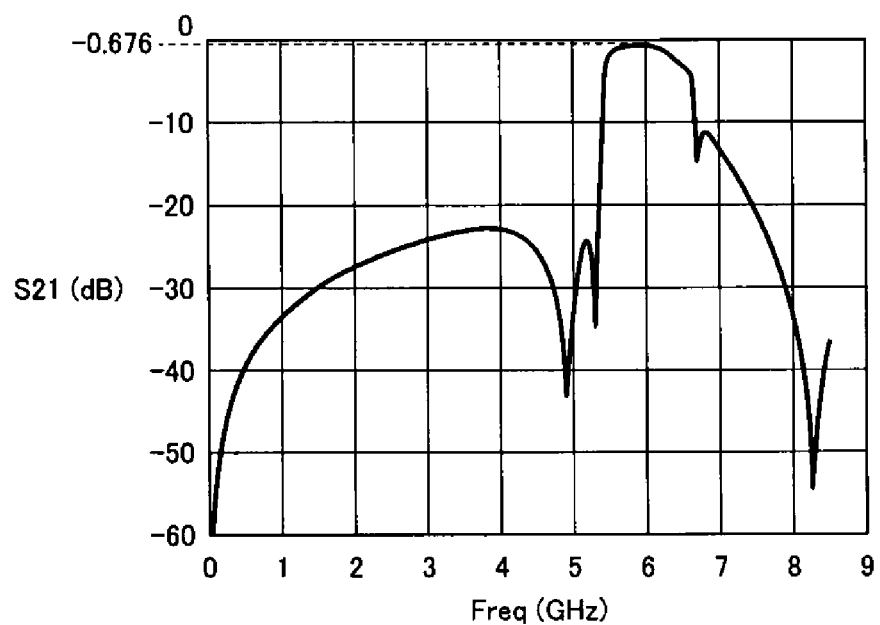
FIG. 8 is a diagram illustrating the insertion loss (S21) of a multilayer band pass filter according to the second preferred embodiment of the present invention.

FIG. 8 is a diagram illustrating the insertion loss (S21) of the multilayer band pass filter 200 according to the second preferred embodiment. As illustrate in FIG. 8, the peak value of S21 of the multilayer band pass filter 200 is about −0.676.

When comparing the multilayer band pass filter 200 according to the second preferred embodiment with the multilayer band pass filter 100 of the first preferred embodiment, the peak value of S21 is closer to zero in the multilayer band pass filter 200 than in the multilayer band pass filter 100. Thus, the insertion loss is smaller in the multilayer band pass filter 200 that in the multilayer band pass filter 100.

As described above, according to the multilayer band pass filter 200 of the second preferred embodiment, the parasitic resistance of each inductor electrode is reduced by setting the sum of the number of the first via electrodes and the number of the second via electrodes to be four. As a result, the Q factor is improved and the insertion loss is reduced.

In the second preferred embodiment, the respective second connection points of the line electrodes 211 to 214 are preferably close to the center of the multilayer band pass filter 200. With this arrangement, many via electrodes are arranged in locations where energy flows and, thus, parasitic resistance of the inductor electrodes is effectively reduced. As a result, the second preferred embodiment enables the insertion loss to be reduced to a greater extent than in the first preferred embodiment.

Third Preferred Embodiment

In the second preferred embodiment, descriptions have been provided regarding the case in which a single-layer line electrode is included in the inductor electrode of each of the LC parallel resonators. The inductor electrode may include two or more line electrode layers. In a third preferred embodiment of the present invention, a case in which the inductor electrode includes two or more line electrode layers will be described. Such a configuration enables the parasitic resistance of the inductor electrode to be further reduced.

Unlike the second preferred embodiment, the inductor electrode in the third preferred embodiment preferably includes two line electrode layers. The rest of the structure is the same or substantially the same as that in the second preferred embodiment and, thus, description thereof is not repeated.

Figure 9:
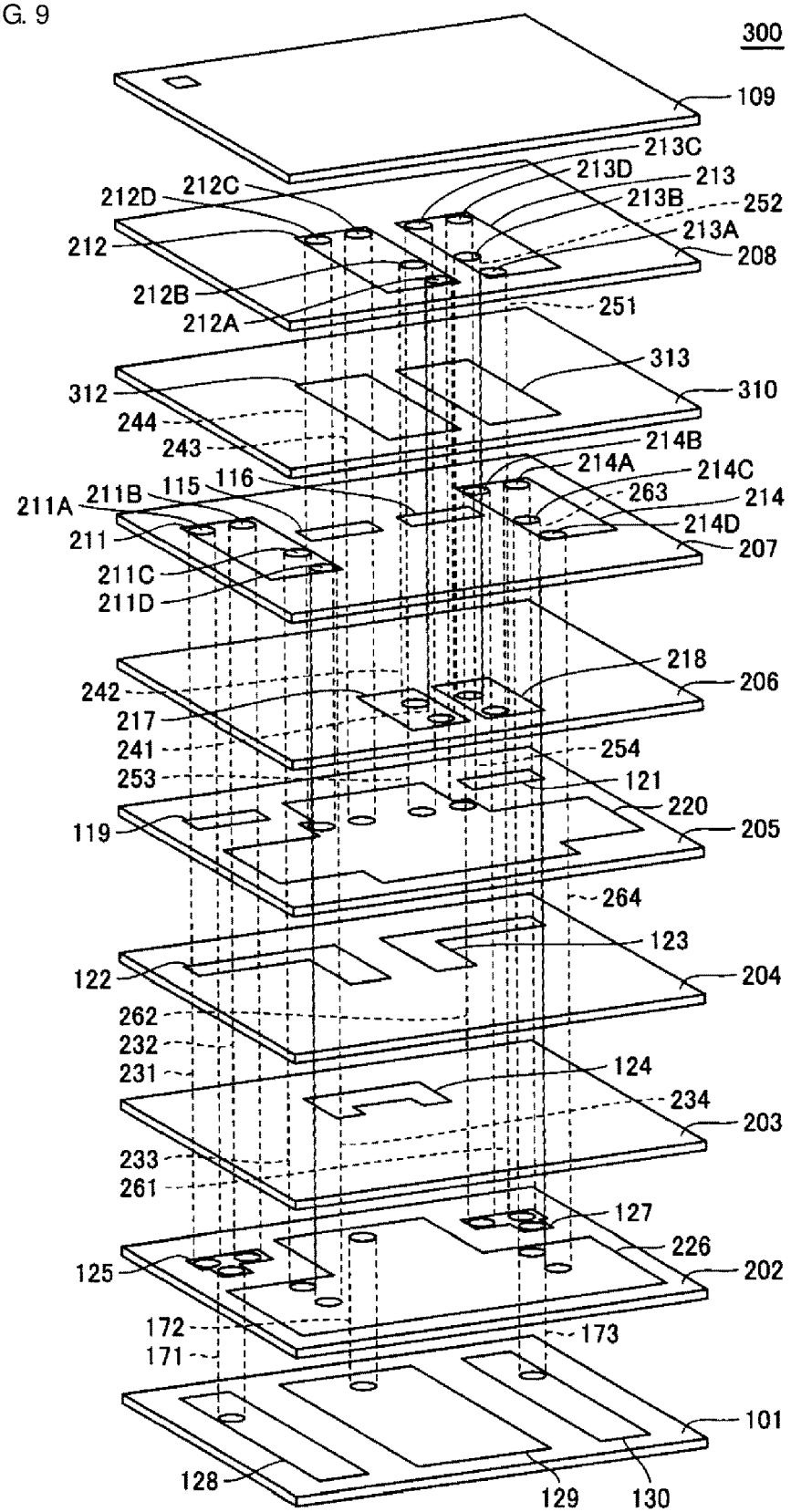
FIG. 9 is an exploded perspective view of a multilayer band pass filter according to a third preferred embodiment of the present invention.
Figure 10:
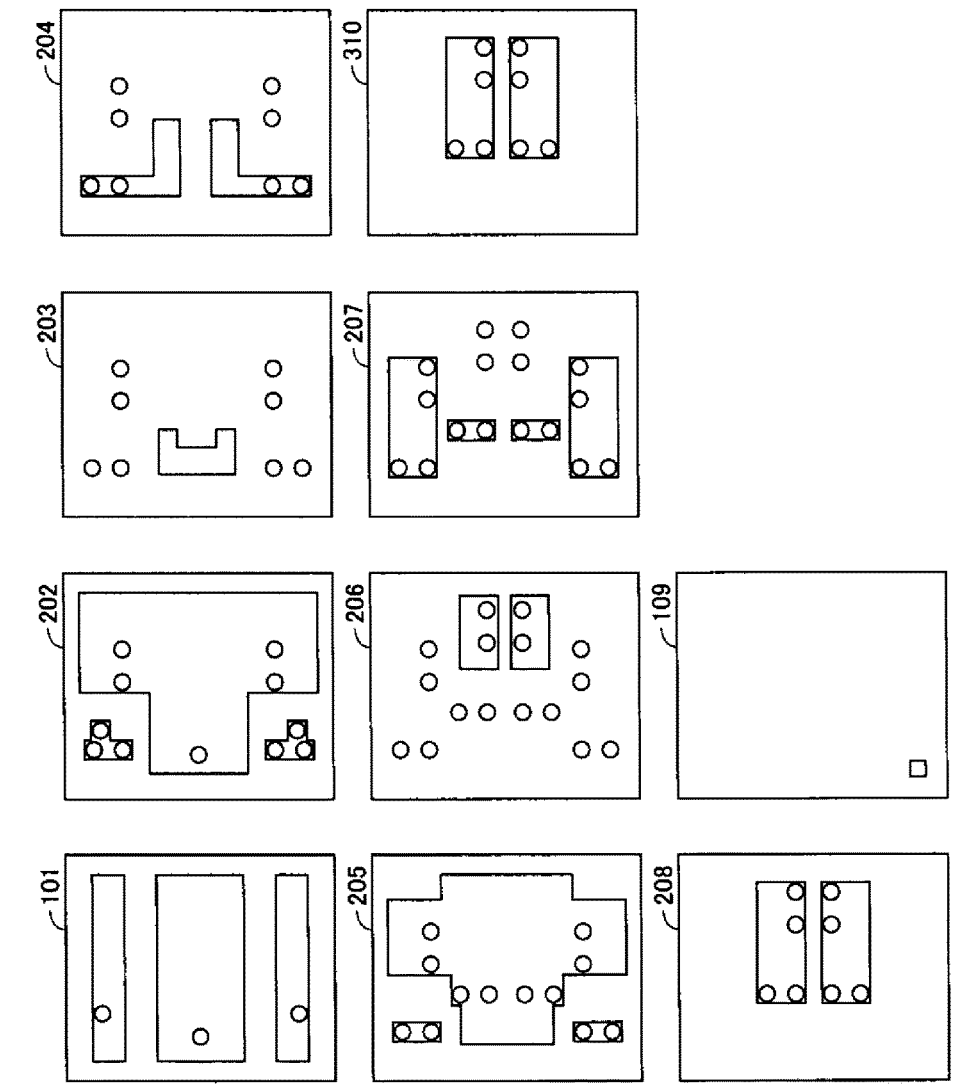
FIG. 10 is a plan view illustrating the individual dielectric layers of the multilayer band pass filter of FIG. 9.

FIG. 9 is an exploded perspective view of a multilayer band pass filter 300 according to a third preferred embodiment. FIG. 10 is a plan view illustrating the individual dielectric layers of the multilayer band pass filter 300 of FIG. 9.

As illustrated in FIG. 9, the multilayer band pass filter 300 includes dielectric layers 101, 202 to 207, 310, 208, and 109. The dielectric layer 310 includes line electrodes 312 and 313.

The multilayer band pass filter 300 includes first to fourth LC parallel resonators.

The second LC parallel resonator includes the capacitor electrode 217 and a second inductor electrode. The second inductor electrode includes the line electrode 212 (first line electrode), the line electrode 312 (second line electrode), the via electrodes 241 and 242 (first via electrodes), and the via electrodes 243 and 244 (second via electrodes).

The via electrode 241 connects the capacitor electrode 217 to the connection point 212A of the line electrode 212. The via electrode 241 extends through a line electrode 312. The via electrode 242 connects the capacitor electrode 217 to the connection point 212B of the line electrode 212. The via electrode 242 extends through the line electrode 312.

The via electrode 243 connects the ground electrode 220 to the connection point 212C of the line electrode 212. The via electrode 243 extends through the line electrode 312. The via electrode 244 connects the ground electrode 220 to the connection point 212D of the line electrode 212. The via electrode 244 extends through the line electrode 312.

The third LC parallel resonator includes the capacitor electrode 218 and a third inductor electrode. The third inductor electrode includes the line electrode 213 (first line electrode), the line electrode 313 (second line electrode), the via electrodes 251 and 252 (first via electrodes), and the via electrodes 253 and 254 (second via electrodes).

The via electrode 251 connects the capacitor electrode 218 to the connection point 213A of the line electrode 213. The via electrode 251 extends through the line electrode 313. The via electrode 252 connects the capacitor electrode 218 to the connection point 213B of the line electrode 213. The via electrode 252 extends through the line electrode 313.

The via electrode 253 connects the ground electrode 220 to the connection point 213C of the line electrode 213. The via electrode 253 extends through the line electrode 313. The via electrode 254 connects the ground electrode 220 to the connection point 213D of the line electrode 213. The via electrode 254 extends though the line electrode 313.

As described above, according to the multilayer band pass filter 300 of the third preferred embodiment, the parasitic resistance of each inductor electrode is effectively reduced by setting the sum of the number of the first via electrodes and the number of the second via electrodes to be four. As a result, the Q factor is improved and the insertion loss is reduced. In the third preferred embodiment, the parasitic resistance of the inductor electrodes is further reduced as a result of the inductor electrodes including two line electrode layers.

Fourth Preferred Embodiment

In the third preferred embodiment, a case in which the first line electrode and the second line electrode have substantially the same shape has been described. The first line electrode and the second line electrode may preferably have different shapes. In a fourth preferred embodiment, a case in which the first line electrode has a smaller area than the second line electrode will be described.

When forming a plurality line electrode layers having the same or substantially the same shape by stacking them on top of one another, distortion is likely to be generated at the end portions of the line electrodes since the shrinkage factor of the ceramic at the end portions of the line electrodes is different from the shrinkage factor of metal layers of the line electrodes. Stress due to this distortion is likely to cause cracks to be generated in the line electrodes.

Thus, in the fourth preferred embodiment, the area of the first line electrode is preferably smaller than the area of the second line electrode, by configuring the plurality of line electrode layers that are stacked on top of one another so as to have different areas. With such a configuration, the distortion of the end portions of the line electrodes is able to be dispersed. As a result, the stress caused by the distortion of the end portions is reduced, and the generation of cracks at the line electrodes is effectively reduced or prevented.

Figure 11:
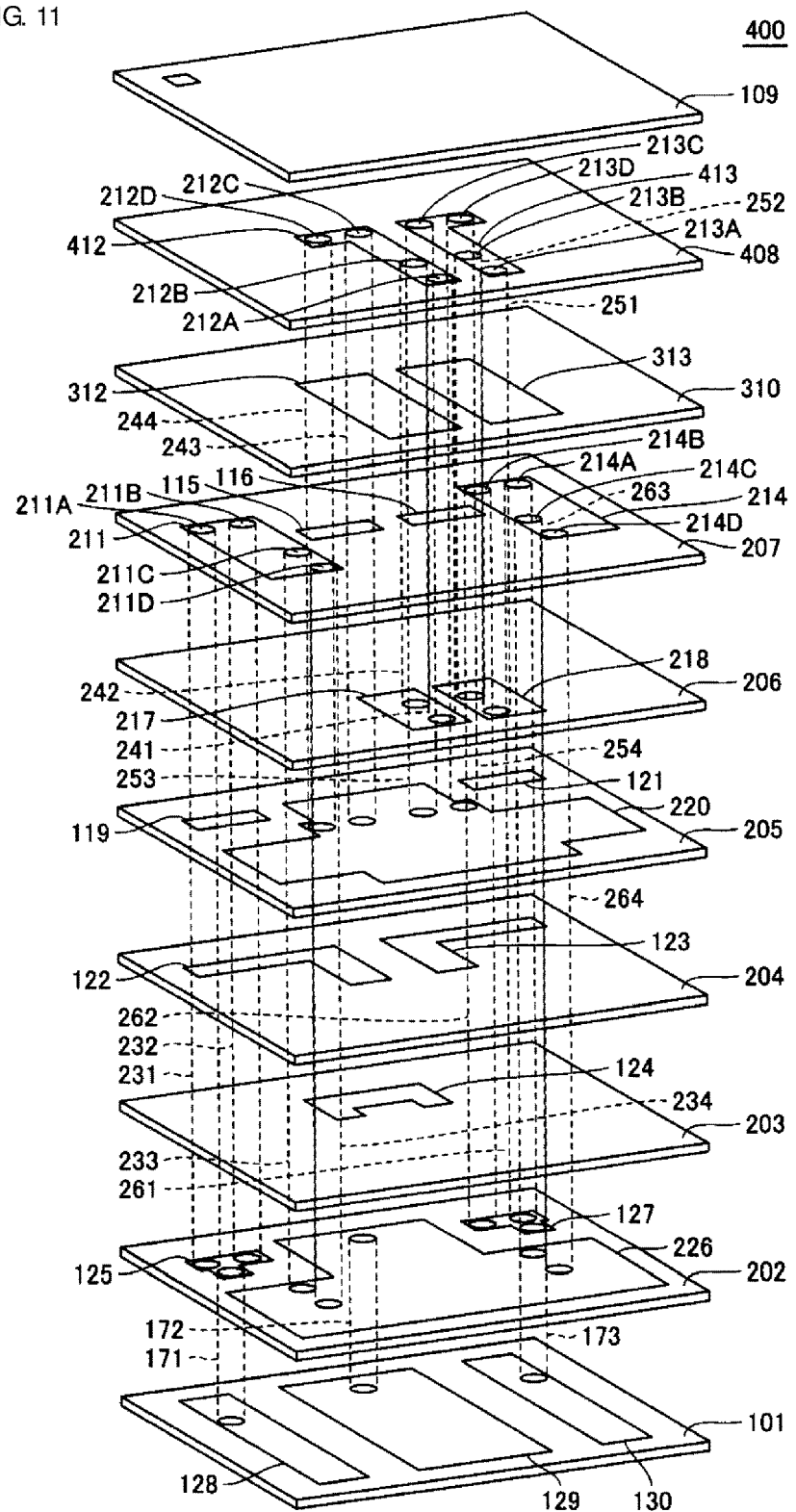
FIG. 11 is an exploded perspective view of a multilayer band pass filter according to a fourth preferred embodiment of the present invention.
Figure 12:
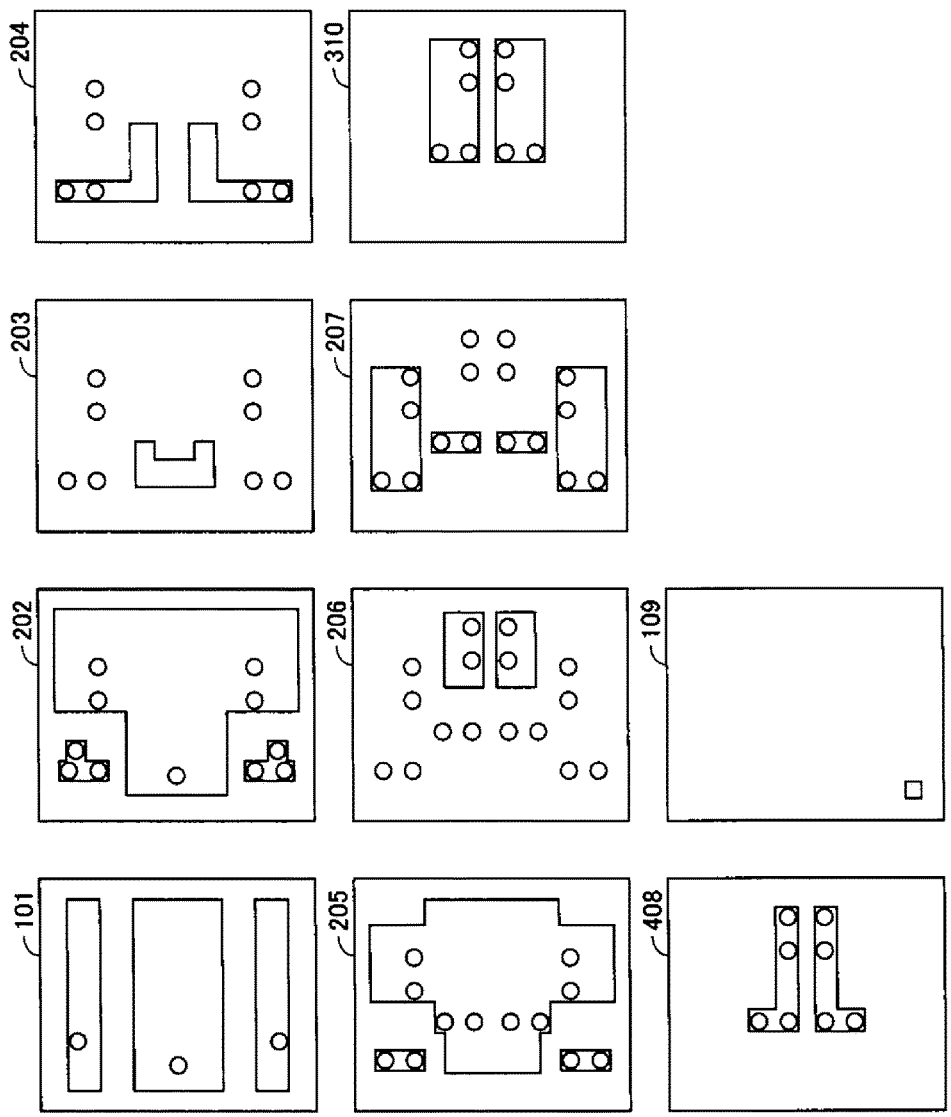
FIG. 12 is a plan view illustrating the individual dielectric layers of the multilayer band pass filter of FIG. 11.

FIG. 11 is an exploded perspective view of a multilayer band pass filter 400 according to a fourth preferred embodiment of the present invention. FIG. 12 is a plan view illustrating the individual dielectric layers of the multilayer band pass filter 400 of FIG. 11.

As illustrated in FIG. 11, the multilayer band pass filter 400 includes dielectric layers 101, 202 to 207, 310, 408, and 109. The dielectric layer 408 includes line electrodes 412 and 413.

The multilayer band pass filter 400 includes first to fourth LC parallel resonators.

The arrangement of the connection points 212A and 212B (first connection points) and the connection points 212C and 212D (second connection points) is preferably a substantially L-shaped arrangement, for example. A line electrode 412 is preferably substantially L-shaped so as to match this substantially L-shaped arrangement. The line electrode 412 preferably has a smaller area than the line electrode 312.

The arrangement of the connection points 213A and 213B (first connection points) and the connection points 213C and 213D (second connection points) is preferably a substantially L-shaped arrangement. A line electrode 413 is preferably substantially L-shaped to match this substantially L-shaped arrangement. The line electrode 413 preferably has a smaller area than the line electrode 313.

According to the multilayer band pass filter 400 of the fourth preferred embodiment, the parasitic resistance of each inductor electrode is reduced by setting the sum of the number of the first via electrodes and the number of the second via electrodes to be four. As a result, the Q factor is improved and the insertion loss is reduced.

Further, in the fourth preferred embodiment, the stress is reduced by configuring the areas of the line electrodes 412 and 413 (first line electrodes) so as to be smaller than the areas of the line electrodes 312 and 313 (second line electrodes). As a result, the generation of cracks due to stress is effectively reduced or prevented.

FIG. 13 is a table summarizing the number of line electrode layers, a via electrode arrangement, and the peak value of S21, in each of the comparative example and the preferred embodiments. As illustrated in FIG. 13, when the second preferred embodiment and the third preferred embodiment are compared with each other, since the number of line electrode layers of the inductor electrode in the third preferred embodiment is larger than that of the second preferred embodiment, the insertion loss is smaller in the third preferred embodiment than in the second preferred embodiment.

When the third preferred embodiment and the fourth preferred embodiment are compared with each other, both of them have almost the same insertion loss. In the fourth preferred embodiment, the generation of cracks due to stress is reduced. As a result, the fourth preferred embodiment has high structural reliability while providing a similar reduction in the insertion loss, as compared with the third preferred embodiment.

Figure 14:
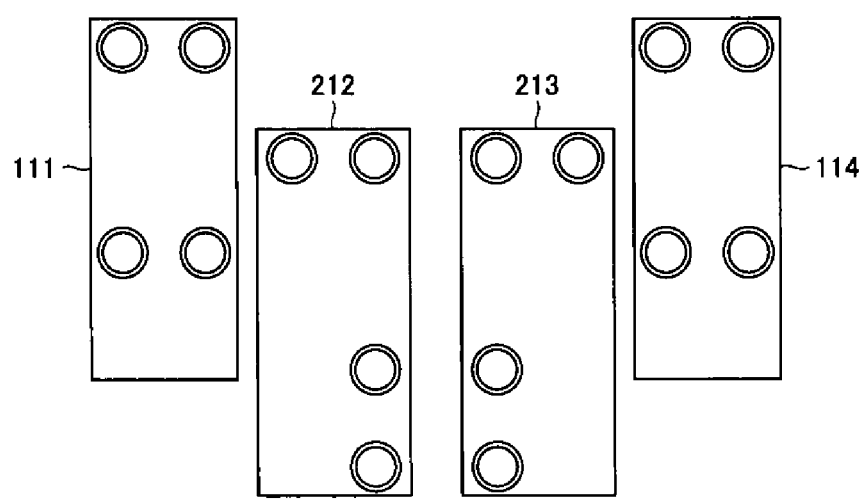
FIG. 14 is a diagram illustrating another arrangement of via electrodes.
Figure 15:
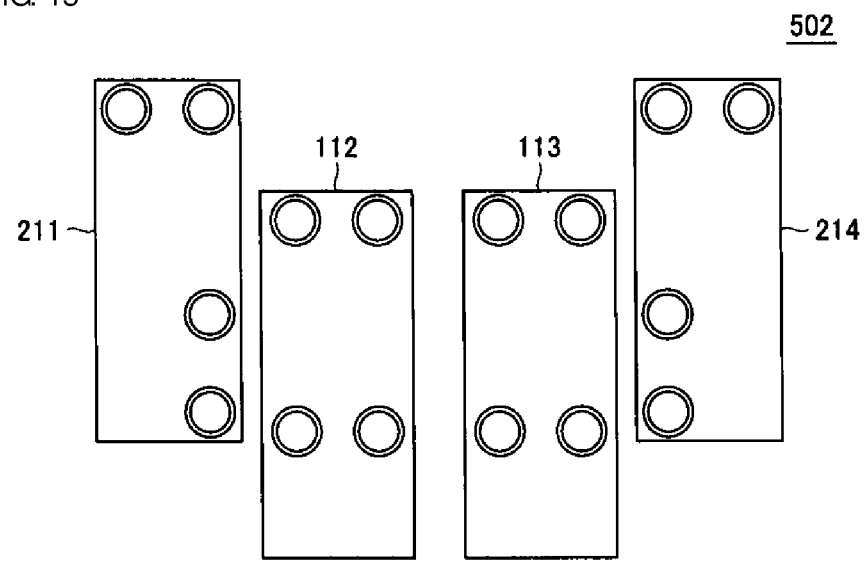
FIG. 15 is a diagram illustrating another arrangement of via electrodes.

The arrangements of via electrodes described in the first to fourth preferred embodiments are preferably the same or substantially the same in the first to fourth LC parallel resonators. The arrangements of via electrodes need not be the same in the first to fourth LC parallel resonators. For example, a parallel arrangement and a substantially L-shaped arrangement may be combined as in a multilayer band pass filter 501 illustrated in FIG. 14 and a multilayer band pass filter 502 illustrated in FIG. 15.

Figure 16:
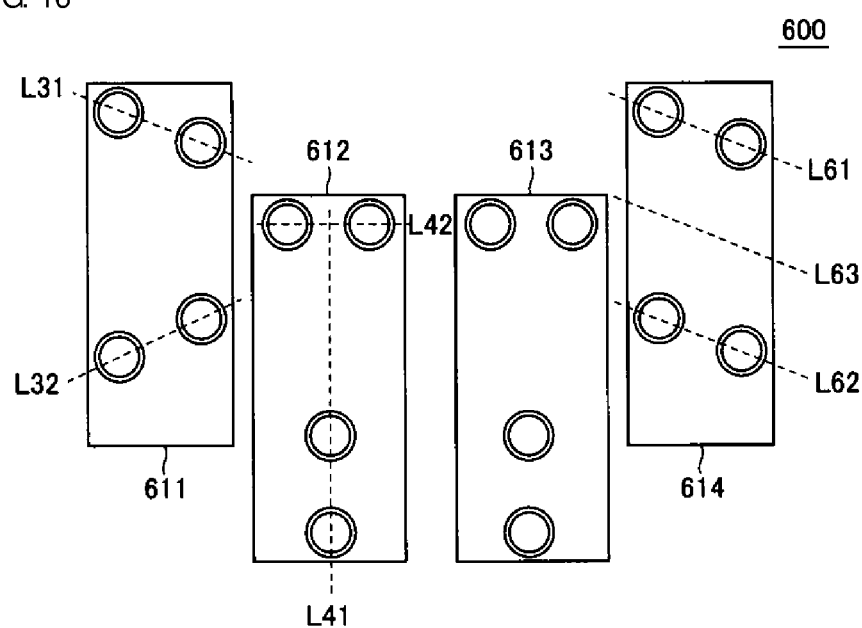
FIG. 16 is a diagram illustrating another arrangement of via electrodes.

Regarding the arrangements of via electrodes illustrated in the first to fourth preferred embodiments, the first virtual line and the second virtual line are parallel or substantially parallel to each other or perpendicular or substantially perpendicular to each other. The first virtual line and the second virtual line need not be parallel or substantially parallel to each other or perpendicular or substantially perpendicular to each other. For example, as in a line electrode 611 of a multilayer band pass filter 600 illustrated in FIG. 16, a virtual line L31 (first virtual line) and a virtual line L32 (second virtual line) need not be parallel or substantially parallel to each other or perpendicular or substantially perpendicular to each other.

Regarding the arrangement of via electrodes illustrated in the first preferred embodiment, the first virtual line is oriented in the direction in which the first to fourth LC parallel resonators are arranged. The first virtual line need not be oriented in this direction. For example, as in a line electrode 614 of the multilayer band pass filter 600 illustrated in FIG. 16, a configuration may be provided in which while a virtual line L61 (first virtual line) and a second virtual line L62 (second virtual line) are parallel or substantially parallel to each other, the virtual line L61 is not oriented in the direction in which the first to fourth LC parallel resonators are arranged. As illustrated by the line electrode 614 in FIG. 16, the first connection points and the second connection points need not be line-symmetric about a virtual line L63 (third virtual line) which is spaced apart from the second virtual line L61 and the virtual line L62 by the same or substantially the same distance.

Regarding the arrangement of via electrodes illustrated in the second preferred embodiment, the first virtual line and the second virtual line are perpendicular or substantially perpendicular to each other, and the first connection points and the second connection points substantially form an L shape. The first connection points and the second connection points may not substantially form an L shape, and may substantially form a T shape, for example, as illustrated by line electrodes 612 and 613 in FIG. 16.

Figure 17:
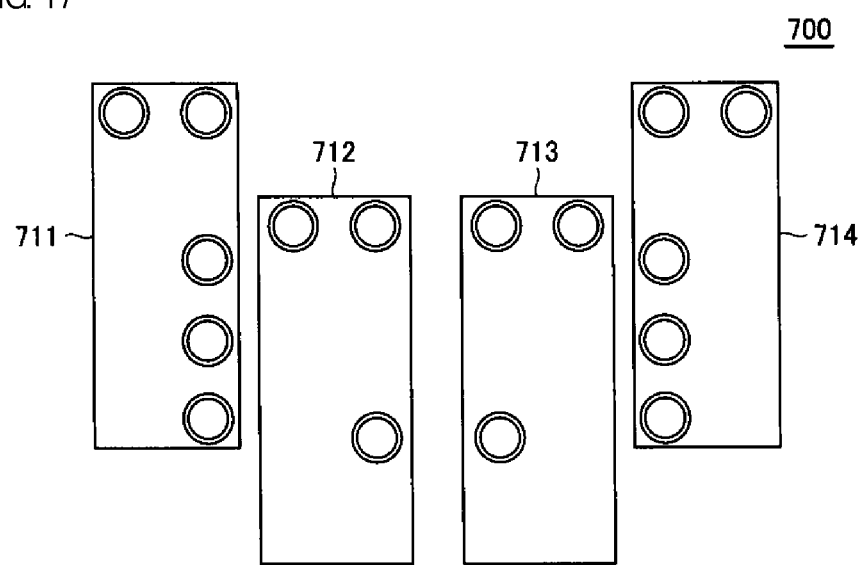
FIG. 17 is a diagram illustrating another arrangement of via electrodes.

Regarding the number of via electrodes illustrated in the first to fourth preferred embodiment, the number of the first via electrodes and the number of the second via electrodes are both two. The number of the first via electrodes and the number of the second via electrodes are not limited to two. The number of the first via electrodes and the number of the second via electrodes may be any number, as long as the parasitic resistance of all of the inductor electrodes is reduced. For example, as in the line electrodes 711 and 714 of a multilayer band pass filter 700 illustrated in FIG. 17, three or more of the first via electrodes or the second via electrodes may be provided. Alternatively, as in the line electrodes 712 and 713, when the number of the first via electrodes is two or more, the number of the second via electrodes may be one, or vice versa.

Figure 18:
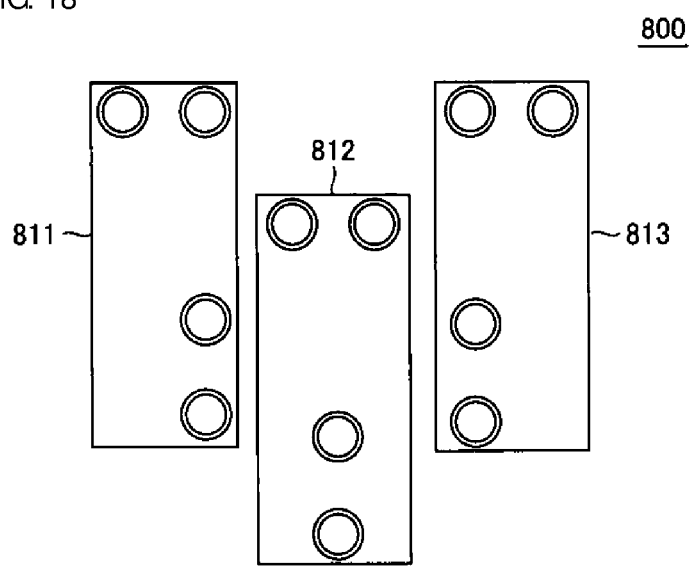
FIG. 18 is a diagram illustrating an example in which the type of a multilayer band pass filter is "101".
Figure 19:
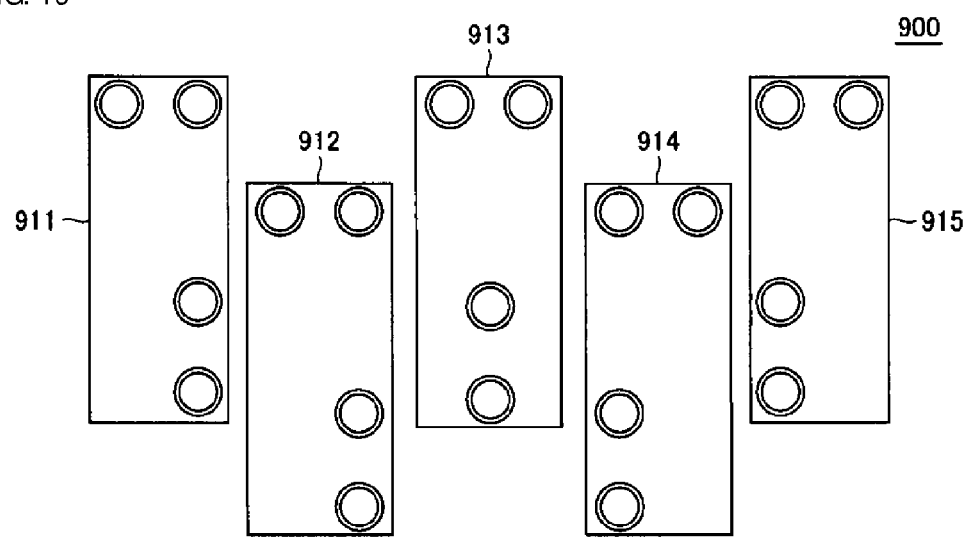
FIG. 19 is a diagram illustrating an example in which the type of a multilayer band pass filter is "10101".
Figure 20:
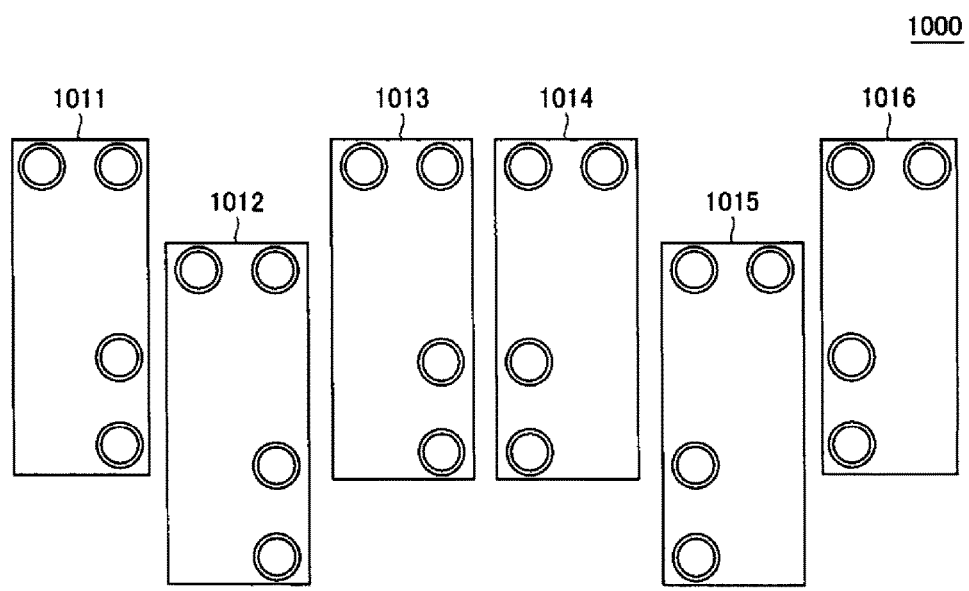
FIG. 20 is a diagram illustrating an example in which the type of a multilayer band pass filter is "101101".

The type of any of the multilayer band pass filters illustrated in the first to fourth preferred embodiments is "1001". The type of multilayer band pass filter according to the preferred embodiments is not limited to "1001". For example, the type of multilayer band pass filter according to the preferred embodiments may be type "101" corresponding to a multilayer band pass filter 800 illustrated in FIG. 18, type "10101" corresponding to a multilayer band pass filter 900 illustrated in FIG. 19, or type "101101" corresponding to a multilayer band pass filter 1000 illustrated in FIG. 20.

The diameters of the via electrodes illustrated in the first to fourth preferred embodiments are the same or substantially the same. The diameters of the via electrodes may not be the same or substantially the same. For example, in the line electrodes 712 and 713 of FIG. 17, by increasing the diameter of a via electrode, only one of which is provided, among the first via electrode(s) and the second via electrode (s), the parasitic resistance of all of the inductor electrodes is reduced and the insertion loss is reduced. However, when via electrodes having different diameters are provided, manufacturing costs are increased as compared to the case in which the via electrodes have the same or substantially the same diameter. It can appropriately be determined whether or not the diameter of a certain via electrode is made to be larger than the rest of the via electrodes, by considering the balance between a reduction in the insertion loss and an increase in manufacturing costs.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC parallel resonator comprising:
   a plurality of dielectric layers stacked on top of one another;
   a capacitor electrode; and
   an inductor electrode defining a loop and including a connection point, as a start point, connected to the capacitor electrode; wherein
   the inductor electrode includes:
      a first line electrode extending in a direction perpendicular or substantially perpendicular to a stacking direction of the plurality of dielectric layers,
      two or more first via electrodes arranged in parallel or substantially in parallel with one another, extending in the stacking direction, and connecting the capacitor electrode to the first line electrode, and
      two or more second via electrodes arranged in parallel or substantially in parallel with one another, extending in the stacking direction, and being connected to the first line electrode;
   a sum of a number of the two or more first via electrodes and a number of the one or more second via electrodes is at least four;
   first connection points between the two or more first via electrodes and the first line electrode are arranged along a first virtual line;
   second connection points between the two or more second via electrodes and the first line electrode are arranged along a second virtual line; and
   the first virtual line is perpendicular or substantially perpendicular to the second virtual line.

2. The LC parallel resonator according to claim 1, further comprising:
   a second line electrode extending in a direction perpendicular or substantially perpendicular to the stacking direction, and neighboring the first line electrode in the stacking direction; wherein
   end portions of the two or more first via electrodes and end portions of the one or more second via electrodes are connected to the first line electrode; and the two or more first via electrodes and the one or more second via electrodes extend through the second line electrode.

3. The LC parallel resonator according to claim 2, wherein the first line electrode has a smaller area than the second line electrode.

4. The LC parallel resonator according to claim 2, wherein the first line electrode is L-shaped or substantially L-shaped.

5. The LC parallel resonator according to claim 1, wherein the first connection points are line-symmetric with the second connection points about a third virtual line spaced apart from the first virtual line and the second virtual line by the same or substantially the same distance.

6. The LC parallel resonator according to claim 1, wherein the first connection points and the second connection points are T-shaped or substantially T-shaped.

7. The LC parallel resonator according to claim 1, wherein the first connection points and the second connection points are L-shaped or substantially L-shaped.

8. A multilayer band pass filter comprising:
three or more LC parallel resonators; wherein
each of the three or more LC parallel resonators are defined by the LC parallel resonator according to claim 1; and
when surfaces of the loops defined by the inductor electrodes of neighboring LC parallel resonators among the three or more LC parallel resonators are viewed in a direction in which the inductor electrodes are arranged, the surfaces of the loops are at least partially superposed with each other.

9. The multilayer band pass filter according to claim 8, wherein the first line electrode of each of second and third LC parallel resonators of the three or more LC parallel resonators is L-shaped or substantially L-shaped.

10. The multilayer band pass filter according to claim 8, wherein the first line electrode of each of second and third LC parallel resonators of the three or more LC parallel resonators is smaller than the first line electrode of each of first and fourth LC parallel resonators of the three or more LC parallel resonators.

11. The multilayer band pass filter according to claim 8, further comprising:
an input electrode; and
an output electrode; wherein
the three or more LC parallel resonators include:
a first LC parallel resonator connected to the input electrode;
a second LC parallel resonator neighboring an inductor electrode of the first LC parallel resonator;
a third LC parallel resonator; and
a fourth LC parallel resonator that neighbors the inductor electrode of the third LC parallel resonator and that is connected to the output electrode; wherein
the third LC parallel resonator is arranged between the second LC parallel resonator and the fourth LC parallel resonator;
a direction of the loop defined by the inductor electrode of the first LC parallel resonator and a direction of the loop defined by the inductor electrode of the second LC parallel resonator are opposite to each other; and
a direction of the loop defined by the inductor electrode of the third LC parallel resonator and a direction of the loop defined by the inductor electrode of the fourth LC parallel resonator are opposite to each other.

12. The multilayer band pass filter according to claim 11, wherein
in each of the second LC parallel resonator and the third LC parallel resonator, the first connection points are line-symmetric with the second connection points about a third virtual line spaced apart from the first virtual line and the second virtual line by the same or substantially the same distance; and
the second virtual line in the second LC parallel resonator and the second virtual line in the third LC parallel resonator are oriented in the direction in which the corresponding inductor electrodes are arranged.

13. The multilayer band pass filter according to claim 11, wherein
the second virtual line in the second LC parallel resonator and the second virtual line in the third LC parallel resonator are oriented in the direction in which the corresponding inductor electrodes are arranged.

14. The multilayer band pass filter according to claim 11, wherein
in each of the second LC parallel resonator and the third LC parallel resonator, the first connection points and the second connection points are L-shaped or substantially L-shaped;
one of the first connection points in the second LC parallel resonator is located nearer to the third LC parallel resonator that the first LC parallel resonator; and
one of the first connection points in the third LC parallel resonator is located nearer to the second LC parallel resonator that the fourth LC parallel resonator.

* * * * *